US010881002B2

(12) United States Patent
Furukawa (10) Patent No.: US 10,881,002 B2
(45) Date of Patent: Dec. 29, 2020

(54) CAPACITOR MODULE, RESONATOR, WIRELESS POWER TRANSMISSION DEVICE, WIRELESS POWER RECEPTION DEVICE, AND WIRELESS POWER TRANSMISSION SYSTEM (71) Applicant: TDK CORPORATION, Tokyo (JP)

(72) Inventor: Kenji Furukawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 116 days.

(21) Appl. No.: 16/179,038

(22) Filed: Nov. 2, 2018

(65) Prior Publication Data
US 2019/0141835 A1    May 9, 2019

(30) Foreign Application Priority Data

Nov. 6, 2017 (JP) ................................ 2017-213477

(51) Int. Cl.
*H01G 2/06* (2006.01)
*H01G 4/38* (2006.01)
(Continued)

(52) U.S. Cl.
CPC .............. *H05K 1/181* (2013.01); *B60L 53/12* (2019.02); *H01G 4/38* (2013.01); *H03H 7/0115* (2013.01); *H05K 1/0271* (2013.01); *H05K 1/112* (2013.01); *H05K 3/3442* (2013.01); *B60L 2230/14* (2013.01); *B60Y 2200/91* (2013.01); *H01G 2/06* (2013.01); *H01G 4/40* (2013.01); *H02J 7/025* (2013.01); *H02J 50/12* (2016.02); *H05K 2201/09063* (2013.01);
(Continued)

(58) Field of Classification Search
None
See application file for complete search history.

(56) References Cited

U.S. PATENT DOCUMENTS 7,036,217 B2 * 5/2006 Pearson ................. H05K 1/113
228/180.1
8,212,152 B2 * 7/2012 Togashi ............... H05K 1/0271
174/260
(Continued)

FOREIGN PATENT DOCUMENTS

JP   2001-326444 A   11/2001
JP   2003-324030 A   11/2003
(Continued)

*Primary Examiner* — Dion Ferguson
(74) *Attorney, Agent, or Firm* — Oliff PLC (57) ABSTRACT A capacitor module that suppresses the occurrence of solder cracking includes a substrate having a first principal surface and a second principal surface opposite to each other in a thickness direction, and capacitor elements mounted on at least the first principal surface of the substrate, wherein the substrate has a first pad electrode solder-bonded to a first terminal electrode provided at one end side of the capacitor elements and a second pad electrode solder-bonded to a second terminal electrode provided at the other end side of the capacitor elements, and penetrating holes are provided at positions, which overlap a pair of boundary lines that define a boundary between at least a region between the first pad electrode and the second pad electrode and an outside of the region in a plan view, and pass through the substrate in the thickness direction.

18 Claims, 9 Drawing Sheets (51) Int. Cl.
    *H05K 1/18*      (2006.01)
    *H03H 7/01*      (2006.01)
    *H05K 1/11*      (2006.01)
    *B60L 53/12*     (2019.01)
    *H05K 1/02*      (2006.01)
    *H05K 3/34*      (2006.01)
    *H02J 50/12*     (2016.01)
    *H02J 7/02*      (2016.01)
    *H01G 4/40*      (2006.01)

(52) U.S. Cl.
    CPC ............... *H05K 2201/09072* (2013.01); *H05K 2201/10015* (2013.01); *H05K 2201/10522* (2013.01); *H05K 2201/10545* (2013.01)

(56) References Cited

U.S. PATENT DOCUMENTS

| | | | |
|---|---|---|---|
| 9,089,054 B2* | 7/2015 | Hattori | H05K 1/0216 |
| 2005/0225408 A1* | 10/2005 | Yagisawa | H05K 1/0239 |
| | | | 333/24 C |
| 2008/0218984 A1* | 9/2008 | Togashi | H05K 1/0271 |
| | | | 361/749 |
| 2011/0222255 A1* | 9/2011 | Kitano | H05K 1/0231 |
| | | | 361/782 |
| 2014/0111021 A1* | 4/2014 | Nakamura | H01F 38/14 |
| | | | 307/104 |
| 2015/0270065 A1* | 9/2015 | Hattori | H05K 3/3442 |
| | | | 174/255 |
| 2016/0308403 A1* | 10/2016 | Bluvshtein | H02J 50/12 |
| 2017/0063157 A1* | 3/2017 | Ahmed | H02J 50/12 |
| 2017/0063163 A1 | 3/2017 | Fukuzawa et al. | |

FOREIGN PATENT DOCUMENTS

| | | |
|---|---|---|
| JP | 2016-018802 A | 2/2016 |
| JP | 2017-005790 A | 1/2017 |
| JP | 2017-051084 A | 3/2017 |
| WO | 2009/096003 A1 | 8/2009 |

\* cited by examiner

CAPACITOR MODULE, RESONATOR, WIRELESS POWER TRANSMISSION DEVICE, WIRELESS POWER RECEPTION DEVICE, AND WIRELESS POWER TRANSMISSION SYSTEM

BACKGROUND OF THE INVENTION

Field of the Invention

The present invention relates to a capacitor module, a resonator including the capacitor module, and a wireless power transmission device, a wireless power reception device, and a wireless power transmission system, which include the resonator.

Priority is claimed on Japanese Patent Application No. 2017-213477, filed Nov. 6, 2017, the content of which is incorporated herein by reference.

Description of Related Art

In recent years, a wireless power transmission technology for performing wireless power transmission by using a magnetic field resonance method has received attention. For example, when a battery (a secondary battery) installed in an electrically driven vehicle such as an electric vehicle is charged, it is possible to supply external power in a wireless manner by using the wireless power transmission technology without connection to a charging cable (called non-contact charging or non-contact power feeding).

Furthermore, in this wireless power transmission technology, a magnetic field resonance method using a resonance phenomenon between two resonators has been actively discussed (for example, see Patent Documents 1 and 2 below). In the magnetic field resonance method, resonators of a power transmission side and a power reception side use a resonance circuit including a coil and a capacitor. In the magnetic field resonance method, resonance frequencies of these two resonators are caused to become close to each other (or to coincide with each other), and high frequency current and voltage near this resonance frequency are applied to the resonator of the power transmission (a primary) side, so that power is transmitted to the electromagnetically resonated resonator of the power reception (a secondary) side in a wireless manner.

In this magnetic field resonance method, there is an advantage that it is possible to increase a distance between the power transmission side coil and the power reception side coil, as compared with an electromagnetic induction method in which the power transmission side coil and the power reception side coil are electromagnetically coupled to each other by using an electromagnetic induction principle. Furthermore, in the magnetic field resonance method, since it is possible to transmit power of several kW or more over a distance of about several cm to about several tens of cm in a wireless manner, application to various systems is being explored.

PATENT DOCUMENTS

[Patent Document 1] Japanese Unexamined Patent Application, First Publication No. 2017-005790
[Patent Document 2] Japanese Unexamined Patent Application, First Publication No. 2017-051084
[Patent Document 3] Japanese Unexamined Patent Application, First Publication No. 2016-018802
[Patent Document 4] Japanese Unexamined Patent Application, First Publication No. 2001-326444
[Patent Document 5] PCT International Publication No. WO 2009/096003 [Patent Document 6] Japanese Unexamined Patent Application, First Publication No. 2003-324030

SUMMARY OF THE INVENTION

However, when wireless power transmission is performed for the aforementioned electric vehicle, large capacity high frequency current and voltage are applied to the resonators of the power transmission side and the power reception side. In order to cope with this, the capacitor constituting the aforementioned resonator uses a capacitor module in which a plurality of chip capacitors (capacitor elements) are disposed and mounted in an array on a principal surface of a printed wiring substrate (for example, see Patent Document 3 above).

Furthermore, the capacitor module has a structure in which a pair of terminal electrodes provided at both ends of each chip capacitor and a pair of pad electrodes provided on the printed wiring substrate are solder-bonded to each other, so that each chip capacitor is mounted on the printed wiring substrate.

However, in the conventional capacitor module, since there is a difference between thermal expansion coefficients of the chip capacitor and the printed wiring substrate, creep strain occurs in the soldered part due to a change in an environmental temperature. Moreover, when solder cracking occurs due to accumulation thereof, the terminal electrodes and the pad electrodes may be disconnected from each other.

Particularly, when the capacitor module is installed in a vehicle, it is necessary to improve a lifespan according to disconnection due to solder cracking. However, with an increase in the size of parts, fatigue life due to a heat cycle generally has a tendency to be short. Therefore, for on-vehicle use, there is a tendency that it is not possible to use large electric parts (for example, chip type capacitor, resistor and the like).

In addition, as the prior art Documents related to the present invention, there are Patent Documents 4 to 6 for example. In this, Patent Document 4 discloses a configuration in which rectangular parallelepiped penetrating holes are provided from a dielectric substrate through a ground layer in a gap between microstriplines.

On the other hand, Patent Document 5 discloses a configuration in which a hole is provided to pass through a thin plate between a pair of terminals of a chip capacitor.

On the other hand, Patent Document 6 discloses a configuration in which one land formed on one surface of a substrate is conductively connected to the other land formed on the other surface of the substrate via a penetrating hole passing through the substrate.

However, the penetrating holes disclosed in Patent Documents 4 to 6 are not discussed in view of preventing the occurrence of solder cracking, and an object of providing a penetrating hole of the present invention is different from that of Patent Documents 4 to 6.

The present invention has been made to solve the aforementioned problems, and an object of the present invention is to provide a capacitor module that suppresses the occurrence of solder cracking in a soldered part of a terminal electrode of a capacitor element side and a pad electrode of a substrate side, a resonator including the capacitor module, and a wireless power transmission device, a wireless power reception device, and a wireless power transmission system, which include the resonator.

A capacitor module according to an aspect of the present invention includes a substrate having a first principal surface and a second principal surface opposite to each other in a thickness direction, and at least one capacitor element mounted on at least the first principal surface of the substrate, wherein the substrate has a first pad electrode solder-bonded to a first terminal electrode provided at one end side of the capacitor element and a second pad electrode solder-bonded to a second terminal electrode provided at the other end side of the capacitor element, and penetrating holes are provided at positions, which overlap a pair of boundary lines that define a boundary between at least a region between the first pad electrode and the second pad electrode and an outside of the region in a plan view, and pass through the substrate in the thickness direction.

As described above, according to an aspect of the present invention, it is possible to provide a capacitor module that suppresses the occurrence of solder cracking in a soldered part of a terminal electrode of a capacitor element side and a pad electrode of a substrate side. Furthermore, it is possible to provide a resonator including the capacitor module, and a wireless power transmission device, a wireless power reception device, and a wireless power transmission system, which include the resonator.

DETAILED DESCRIPTION OF THE INVENTION

Hereinafter, an embodiment of the present invention will be described in detail with reference to the drawings.

In the drawings used for the following description, characteristic parts may be enlarged for the purpose of convenience in order to facilitate the understanding of characteristics, and it is assumed that the dimensional proportions and the like of respective elements may not be identical to actual dimensions. Furthermore, since materials, dimensions and the like exemplified in the following description are examples, the present invention is not limited thereto and can be embodied through appropriate modification in a range in which the scope of the present invention is not changed.

(Wireless Power Transmission System)

Figure 1:
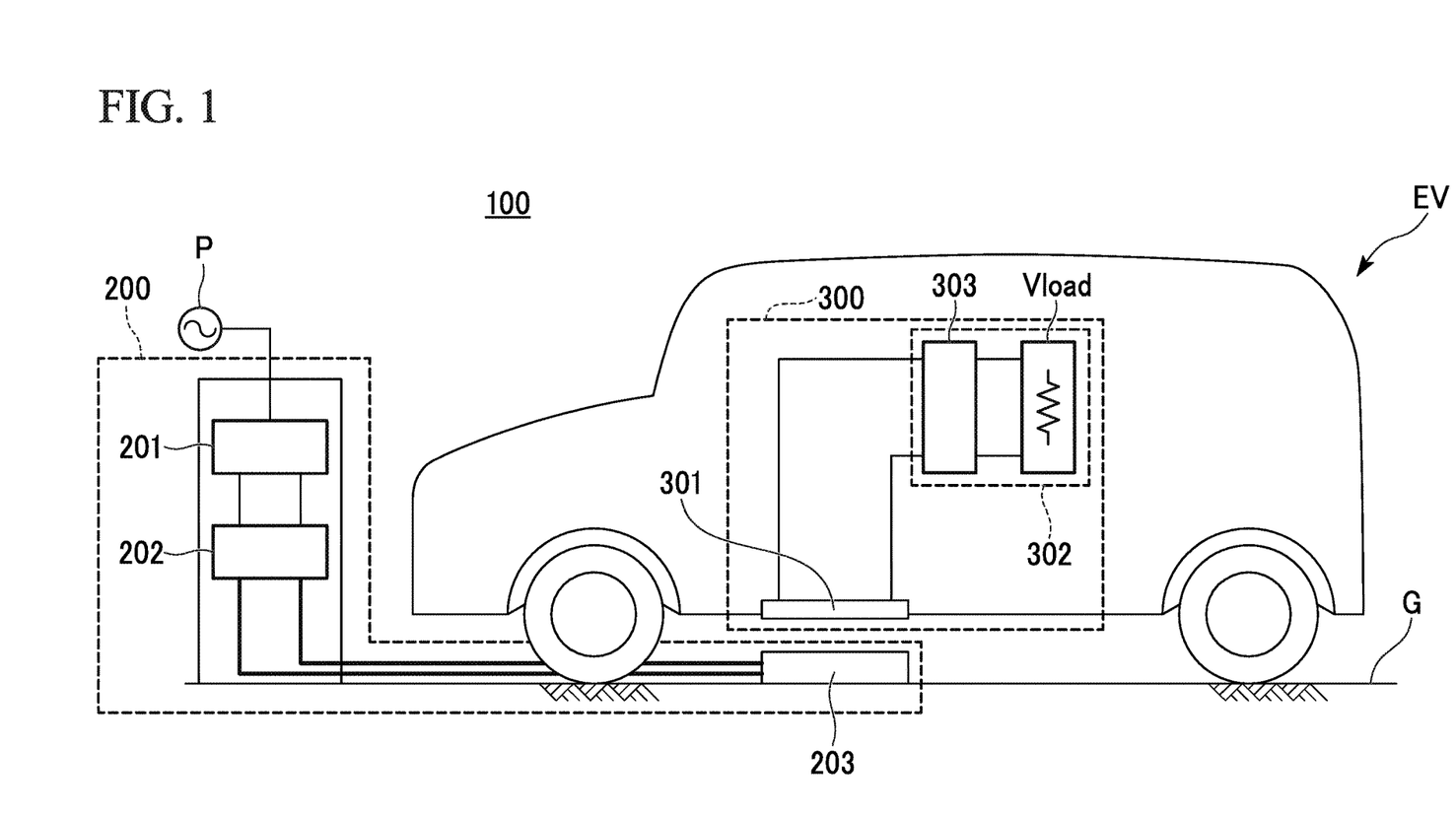
FIG. 1 is a configuration diagram illustrating an example of a wireless power transmission system according to an embodiment of the present invention.
Figure 2:
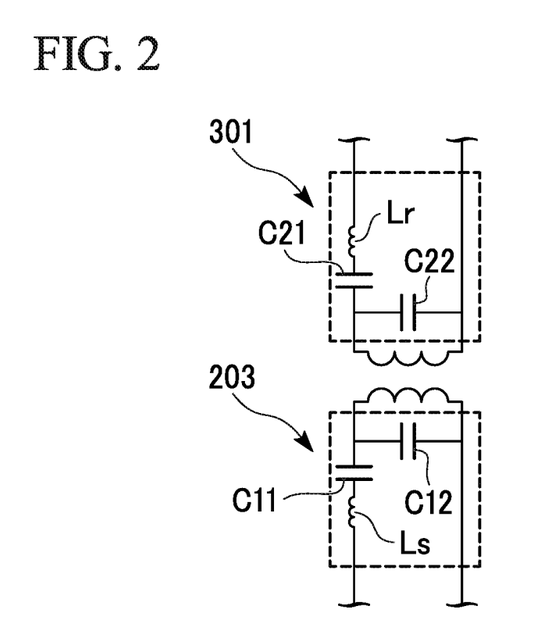
FIG. 2 is a circuit diagram illustrating a configuration of a power transmission side resonator and a power reception side resonator of the wireless power transmission system illustrated in FIG. 1.

Firstly, as an embodiment of the present invention, a wireless power transmission system 100 illustrated in FIG. 1 and FIG. 2 will be described for example. FIG. 1 is a configuration diagram illustrating an example of the wireless power transmission system 100. FIG. 2 is a circuit diagram illustrating a configuration of a power transmission side resonator 203 and a power reception side resonator 301 of the wireless power transmission system 100.

The wireless power transmission system 100 of the present embodiment is obtained by applying the present invention to a non-contact charging system that performs non-contact charging for a battery (a second battery) installed in an electric vehicle EV as illustrated in FIG. 1 and FIG. 2. The electric vehicle EV is an electrically driven vehicle (a moving body) that travels when a motor is driven using the power charged into the battery.

Specifically, the wireless power transmission system 100 of the present embodiment performs wireless power transmission by using a magnetic field resonance method, and includes a wireless power transmission device (hereinafter, referred to a "power transmission device") 200 installed on the ground G of a charging equipment side and a wireless power reception device (hereinafter, referred to a "power reception device") 300 installed in the electric vehicle EV.

The power transmission device 200 generally includes a power supply circuit 201, a driving circuit 202, and the power transmission side resonator 203. On the other hand, the power reception device 300 generally includes the power reception side resonator 301 and a load 302. Furthermore, the load 302 is composed of a rectification circuit 303 and a variable load Vload.

The power supply circuit 201 serves as an AC/DC power supply that is electrically connected to an external commercial power supply P and converts AC power inputted from the commercial power supply P to desired DC power. The power supply circuit 201 is electrically connected to the driving circuit 202. The power supply circuit 201 supplies the converted DC power to the driving circuit 202.

It is sufficient if the power supply circuit 201 outputs DC power to the driving circuit 202, and the configuration of the power supply circuit 201 is not particularly limited. For example, for the power supply circuit 201, there may be a power supply circuit obtained by combining a rectification circuit, which rectifies AC power and converts the rectified AC power to DC power, with a power factor correction (PFC) circuit, which performs power factor improvement, a power supply circuit obtained by combining the same rectification circuit with a switching circuit such as a switching converter, and the like.

The driving circuit 202 converts the DC power supplied from the power supply circuit 201 to high frequency power. For the driving circuit 202, for example, there may be a switching circuit, in which a plurality of switching elements are connected to one another on a bridge basis, and the like. The driving circuit 202 is electrically connected to the power transmission side resonator 203. The driving circuit 202 supplies the power transmission side resonator 203 with high frequency power with a driving frequency controlled on the basis of a resonance frequency of the power transmission side resonator 203.

The power transmission side resonator 203 constitutes an LC resonance circuit including a power transmission side coil L1 and a power transmission side capacitor C1. The resonance frequency of the power transmission side resonator 203 side is caused to become close to the resonance frequency of the power reception side resonator 301 side (or to coincide with the resonance frequency of the power reception side resonator 301 side), so that wireless power transmission using a magnetic field resonance method is possible.

The power transmission side resonator 203 of the present embodiment has a configuration in which a reactor Ls is serially inserted into the power transmission side capacitor C1. In such a configuration, it is easy to control the imaginary part of an impedance of a wireless power transmission network including the power transmission side resonator 203, the power reception side resonator 301, and the load 302 such that it is positive. Furthermore, the reactor Ls has high impedance with respect to a frequency component sufficiently higher than the resonance frequency of the power transmission side resonator 203 side. In this way, the reactor Ls serves as a filter that supplies the power transmission side coil L1 with power with no high frequency component.

The power transmission side coil L1, for example, is configured by a coil for wireless power transmission in which a Litz wire including copper, aluminum and the like has been spirally wound. The power transmission side coil L1 of the present embodiment is installed on the ground G or is buried in the ground G to face a lower side of a floor of the electric vehicle EV. In addition, in the present embodiment, the power transmission side coil L1 (the power transmission side resonator 203) is configured to be installed on the ground G together with the power supply circuit 201.

The power transmission side capacitor C1 has a function of adjusting a driving frequency and both end voltages of the load 302. The power transmission side capacitor C1 of the present embodiment is configured by a first capacitor C11 serially connected to the power transmission side coil L1 and a second capacitor C12 connected to the power transmission side coil L1 in a parallel manner; however, the present invention is not limited to such a configuration. For example, the power transmission side capacitor C1 may be configured to include only the first capacitor C11 serially connected to the power transmission side coil L1.

The power reception side resonator 301 constitutes an LC resonance circuit including a power reception side coil L2 and a power reception side capacitor C2. The resonance frequency of the power reception side resonator 301 side is caused to become close to the resonance frequency of the power transmission side resonator 203 side (or to coincide with the resonance frequency of the power transmission side resonator 203 side), so that wireless power transmission using the magnetic field resonance method is possible.

The power reception side resonator 301 of the present embodiment has a configuration in which a reactor Lr is serially inserted into the power reception side capacitor C2. In such a configuration, the reactor Lr has high impedance with respect to a frequency component sufficiently higher than the resonance frequency of the power reception side resonator 301 side. In this way, the reactor Lr serves as a filter that supplies the load 302 with power with no high frequency component.

The power reception side coil L2, for example, is configured by a coil for wireless power transmission in which a Litz wire including copper, aluminum and the like has been spirally wound. The power reception side coil L2 of the present embodiment is installed under the floor of the electric vehicle EV to face the power transmission side coil L1 installed on the ground G or buried in the ground G.

The power reception side capacitor C2 has a function of adjusting a driving frequency and both end voltages of the load 302. The power reception side capacitor C2 of the present embodiment is configured by a third capacitor C21 serially connected to the power reception side coil L2 and a fourth capacitor C22 connected to the power reception side coil L2 in a parallel manner; however, the present invention is not limited to such a configuration. For example, the power reception side capacitor C2 may be configured to include only the third capacitor C21 serially connected to the power reception side coil L2.

The rectification circuit 303 is electrically connected to the power reception side resonator 301, rectifies the high frequency power received in the power reception side coil L2, and converts the rectified high frequency power to DC power. For the rectification circuit 303, for example, there may be a half-wave rectification circuit composed of one switching element or a diode and a smoothing capacitor, a full wave rectification circuit composed of four switching elements connected to one another on a bridge basis or a diode and a smoothing capacitor, and the like. The rectification circuit 303 is electrically connected to the variable load Vload. The rectification circuit 303 supplies the converted DC power to the variable load Vload. In the power reception device 300, a charger may be provided between the rectification circuit 303 and the variable load Vload.

The variable load Vload is connected between output terminals of the rectification circuit 303 and stores or consumes the DC power supplied from the rectification circuit 303. For the variable load Vload, there may be a battery, a motor and the like installed in the electric vehicle EV.

The variable load Vload can be regarded as a resistive load in which an equivalent resistance value of the load 302 changes according to the passage of time due to a demand state (a storage state or a consumption state) of power. Since an amount of power consumed in the rectification circuit 303 is sufficiently smaller than that in the variable load Vload, the equivalent resistance value of the load 302 may be regarded as being approximate to an equivalent resistance value of the variable load Vload.

In the wireless power transmission system 100 having the above configuration of the present embodiment, it is possible to transmit power in a wireless manner toward the power reception device 300 from the power transmission device 200 by a magnetic field resonance method using a resonance phenomenon between the power transmission side resonator 203 and the power reception side resonator 301. That is, in the magnetic field resonance method, the resonance frequencies of these two resonators 203 and 301 are caused to become close to each other (or to coincide with each other), and high frequency current and voltage around the resonance frequency are applied to the power transmission side resonator 203, so that power can be transmitted (supplied) to the electromagnetically resonated power reception side resonator 301 in a wireless manner.

Consequently, in the wireless power transmission system 100 of the present embodiment, it is possible to perform non-contact charging for a battery installed in the electric vehicle EV while transmitting power supplied from the charging equipment side to the electric vehicle EV in a wireless manner without connection to a charging cable.

(Capacitor Module)

Next, as a capacitor module employing the present invention, a capacitor module 1 illustrated in FIG. 3 to FIG. 7 will be described for example.

Figure 3:
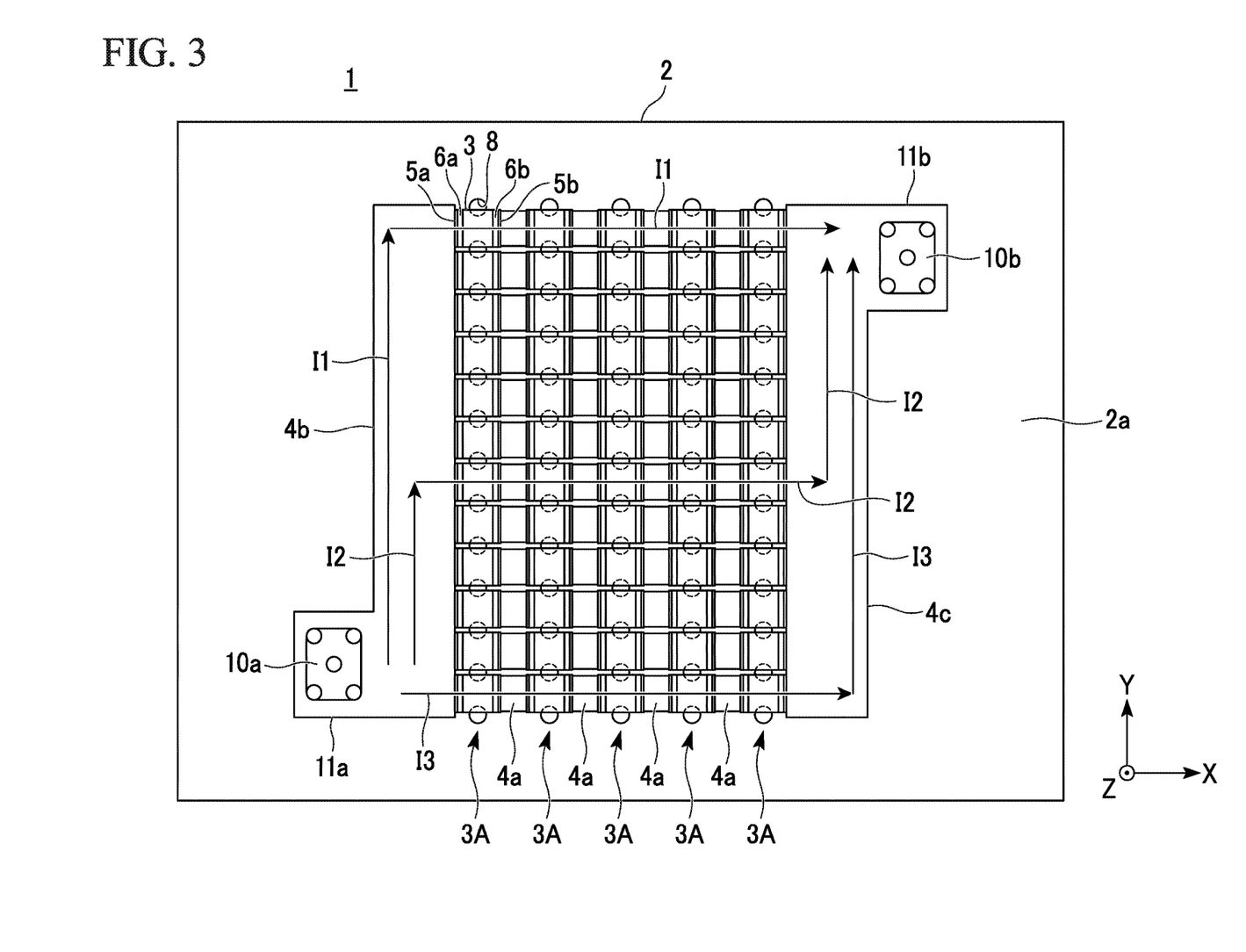
FIG. 3 is a plan view illustrating a configuration of a capacitor module to which the present invention is applied.
Figure 4:
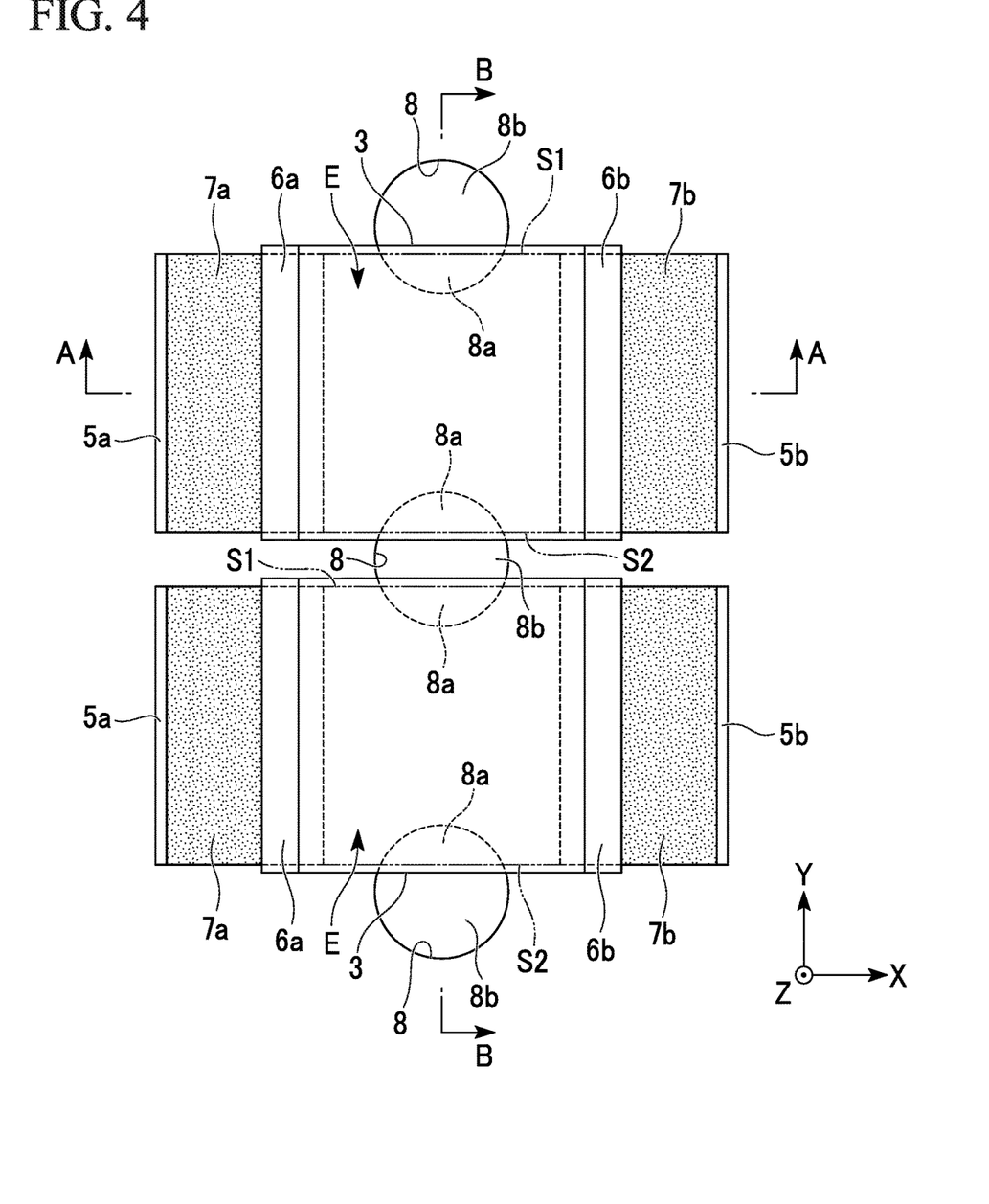
FIG. 4 is an enlarged plan view of main elements of the capacitor module illustrated in FIG. 3.
Figure 5:
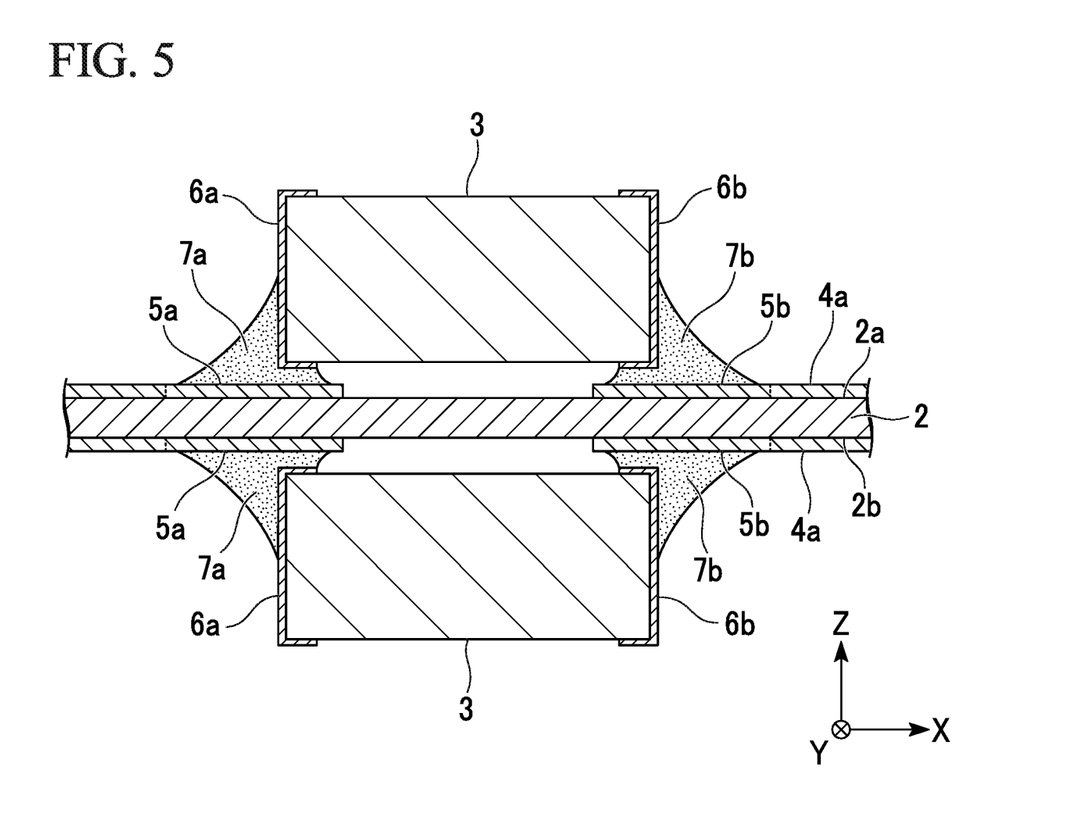
FIG. 5 is a sectional view of the capacitor module taken along line A-A illustrated in FIG. 4.
Figure 6:
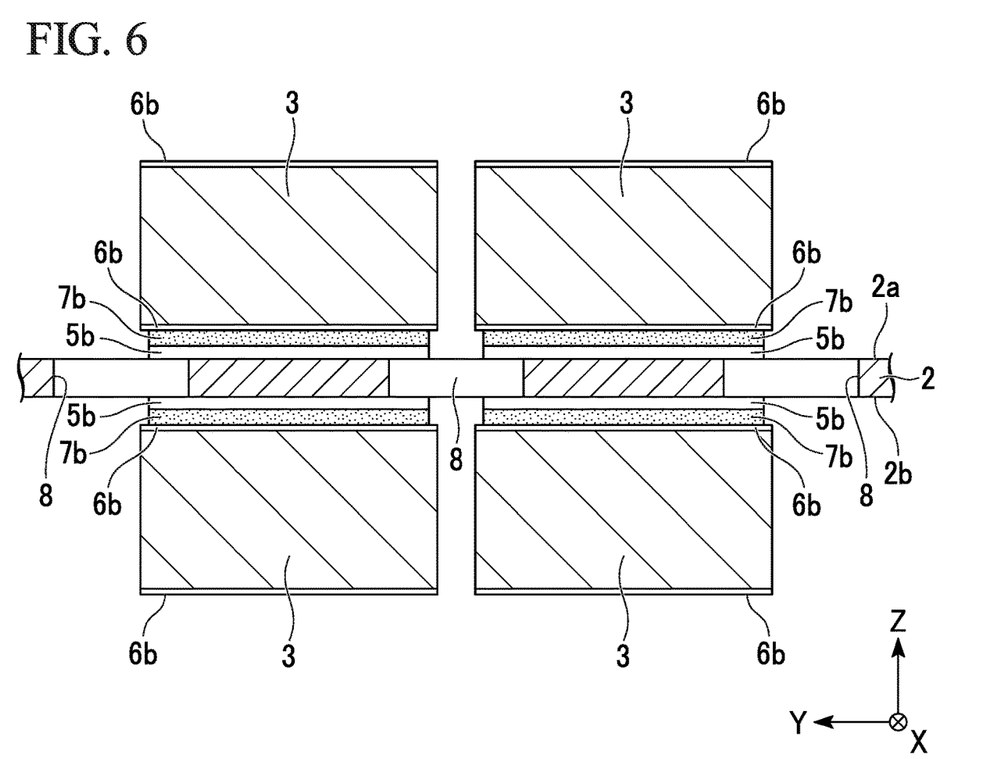
FIG. 6 is a sectional view of the capacitor module taken along line B-B illustrated in FIG. 4.
Figure 7:
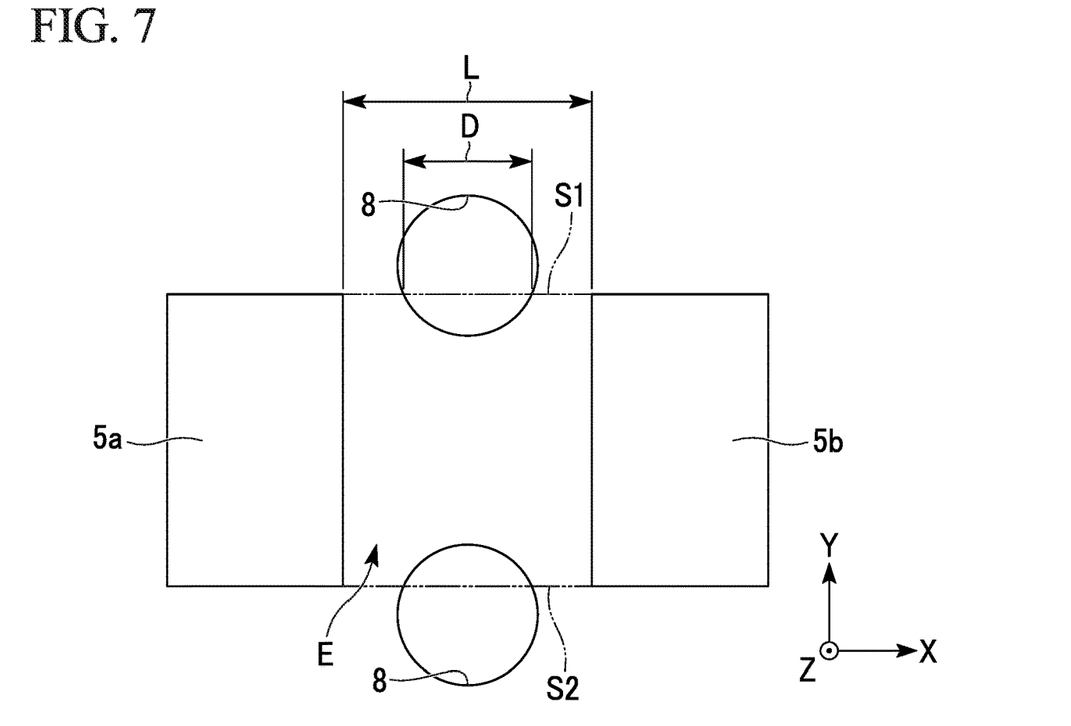
FIG. 7 is an enlarged plan view of main elements of a substrate of the capacitor module illustrated in FIG. 3.

FIG. 3 is a plan view illustrating a configuration of the capacitor module 1. FIG. 4 is an enlarged plan view of main elements of the capacitor module 1. FIG. 5 is a sectional view of the capacitor module 1 taken along line A-A illustrated in FIG. 4. FIG. 6 is a sectional view of the capacitor module 1 taken along line B-B illustrated in FIG. 4. FIG. 7 is an enlarged plan view of main elements of a substrate 2 of the capacitor module 1.

In the following drawings, it is assumed that a XYZ orthogonal coordinate system is set, an X axis direction is a first direction on a horizontal plane of the capacitor module 1, a Y axis direction is a second direction on the horizontal plane of the capacitor module 1, and a Z axis direction is a thickness direction of the capacitor module 1.

The capacitor module 1 of the present embodiment includes the substrate 2 having a first principal surface 2a and a second principal surface 2b opposite to each other in the thickness direction, and a capacitor element group 30 including a plurality of capacitor elements 3 disposed in an array on at least the first principal surface 2a (both principal surfaces 2a and 2b in the present embodiment) of the substrate 2 as illustrated in FIG. 3 to FIG. 7.

Furthermore, the capacitor module 1 of the present embodiment has a structure in which the plurality of capacitor elements 3 are mounted at overlapping positions on the first principal surface 2a and the second principal surface 2b in the plan view. That is, the capacitor module 1 basically has the same mounting structure (a symmetrical structure in which the substrate 2 is interposed between the first principal surface 2a and the second principal surface 2b) at the first principal surface 2a side and the second principal surface 2b side of the substrate 2.

Consequently, in the present embodiment, the mounting structure of the first principal surface (an upper surface) 2a side of the substrate 2 will be described, and unless otherwise specifically mentioned, the mounting structure of the second principal surface (a lower surface) 2b side of the substrate 2 will not be described.

The capacitor element group 30 has a plurality of capacitor element arrays 3A in which the plurality of capacitor elements 3 disposed in the first direction (the X axis direction) of the first direction and the second direction (the Y axis direction) are serially connected to one another, and has a structure in which the plurality of capacitor element arrays 3A disposed in the second direction are connected in parallel to one another, wherein the first direction and the second direction cross each other (are orthogonal to each other in the present embodiment) on the plane of the substrate 2.

The substrate 2 includes a double-sided printed wiring substrate in which a plurality of wiring patterns are provided on both surfaces of an insulating substrate formed in an approximately rectangular flat plate shape as a whole. Specifically, the substrate 2 has a first wiring 4a that electrically connects the capacitor elements 3, which are adjacent to one another in the first direction among the plurality of capacitor elements 3 constituting the capacitor element array 3A, to one another, a second wiring 4b that electrically connects the capacitor elements 3, which are positioned at one end side of the plurality of capacitor element arrays 3A in the first direction among the plurality of capacitor elements 3 constituting the capacitor element array 3A, to one another in the second direction, and a third wiring 4c that electrically connects the capacitor elements 3, which are positioned at the other end side of the plurality of capacitor element arrays 3A in the first direction among the plurality of capacitor elements 3 constituting the capacitor element array 3A, to one another in the second direction.

Furthermore, at positions of the substrate 2 corresponding to each capacitor element 3, a first pad electrode 5a and a second pad electrode 5b are provided. The first pad electrode 5a and the second pad electrode 5b are obtained by patterning a part of the wirings 4a to 4c called lands in a rectangular shape. The first pad electrode 5a and the second pad electrode 5b have the same shape and are juxtaposed in the first direction.

The plurality of capacitor elements 3 include laminated ceramic chip capacitors formed in an approximately rectangular shape in the plan view. Each of the capacitor elements 3 has a first terminal electrode 6a provided along an end edge in a short direction (the second direction) at one end side in a longitudinal direction (the first direction) thereof, and a second terminal electrode 6b provided along an end edge in the short direction (the second direction) at the other end side in the longitudinal direction (the first direction) thereof.

Each of the capacitor elements 3 is mounted on the substrate 2 via a first soldered part 7a in which the first terminal electrode 6a and the first pad electrode 5a are solder-bonded to each other, and a second soldered part 7b in which the second terminal electrode 6b and the second pad electrode 5b are solder-bonded to each other. In this way, each of the capacitor elements 3 is mounted on the substrate 2 bridging between the first pad electrode 5a and the second pad electrode 5b.

Meanwhile, the capacitor module 1 of the present embodiment has a plurality of penetrating holes 8 formed at positions corresponding to the plurality of capacitor elements 3 to pass through the substrate 2 in the thickness direction (the Z axis direction). The penetrating holes 8 have a circular shape in the plan view and are provided at positions, which overlap a pair of boundary lines S1 and S2 that define a boundary between at least a region E between the first pad electrode 5a and the second pad electrode 5b and an outside of the region E, in the plan view. Furthermore, each of the penetrating holes 8 is provided at a position overlapping an outline of each of the capacitor elements 3 mounted on the substrate 2 in the plan view.

The pair of boundary lines S1 and S2 are linear lines that connect the end edges of the first pad electrode 5a and the second pad electrode 5b along the first direction (the X axis direction) to each other. Furthermore, the pair of boundary lines S1 and S2 constitute lines approximately coinciding with the outlines of the capacitor elements 3 mounted on the substrate 2 along the first direction (the X axis direction). The region E is a region surrounded by the end edges of the first pad electrode 5a and the second pad electrode 5b along the second direction (the Y axis direction), in which they face each other, and the pair of boundary lines S1 and S2.

Consequently, the penetrating hole 8 includes regions 8a inward from the boundary lines S1 and S2 and regions 8b outward from the boundary lines S1 and S2 in the plan view. Furthermore, the penetrating hole 8 includes a region overlapping the capacitor element 3 and a region not overlapping the capacitor element 3 in the plan view.

In the capacitor module 1 of the present embodiment, such penetrating holes 8 are provided, so that it is possible to suppress the occurrence of solder cracking in the first and second soldered parts 7a and 7b.

That is, in the capacitor module 1 of the present embodiment, the penetrating holes 8 are provided at positions overlapping the pair of boundary lines S1 and S2 in the plan view, so that it is possible to reduce creep strain occurring in the first and second soldered parts 7a and 7b. That is, a point indicating a maximum value of the creep strain, exists on the pair of boundary lines S1 and S2. And a crack progresses with this point as a starting point. Consequently, the penetrating holes 8 are provided on the pair of boundary lines S1 and S2, so that it is possible to suppress the occurrence of cracking.

In this way, in the capacitor module 1 of the present embodiment, it is possible to improve a lifespan according to disconnection in the first and second soldered parts 7a and 7b while suppressing the occurrence of solder cracking in the first and second soldered parts 7a and 7b.

Furthermore, in the capacitor module 1 of the present embodiment, the penetrating holes 8 are provided in the state of overlapping the boundary line S1 of one capacitor element 3 side and the boundary line S2 of the other capacitor element 3 side in the plan view, wherein the one capacitor element 3 and the other capacitor element 3 are adjacent to each other among the plurality of capacitor elements 3 disposed in the second direction (the Y axis direction).

In such a case, the penetrating hole 8 can be used in common between one capacitor element 3 and the another capacitor element 3 adjacent to each other, as compared with a case where two penetrating holes 8 overlapping the pair of boundary lines S1 and S2 are provided for each capacitor element 3. Consequently, it is possible to suppress the occurrence of solder cracking in the first and second soldered parts 7a and 7b using less penetrating holes 8.

Moreover, in the capacitor module 1 of the present embodiment, the penetrating holes 8 are provided in the state of overlapping the pair of boundary lines S1 and S2, which define the region E between the first pad electrode 5a and the second pad electrode 5b of the first principal surface 2a side, and the pair of boundary lines S1 and S2, which define the region E between the first pad electrode 5a and the second pad electrode 5b of the second principal surface 2b side, in the plan view.

In such a case, the penetrating holes 8 can be used in common between the first principal surface 2a side and the second principal surface 2b side of the substrate 2. In this way, it is possible to achieve miniaturization and integration of the capacitor module 1 while suppressing the occurrence of solder cracking in the first and second soldered parts 7a and 7b.

Furthermore, in the capacitor module 1 of the present embodiment, when a length (hereinafter, referred to as an "inter-electrode length") on the boundary lines S1 and S2 between the first pad electrode 5a and the second pad electrode 5b is set as L and a length (hereinafter, referred to as a "hole length") on the boundary lines S1 and S2 of the penetrating hole 8 is set as D, it is preferable to satisfy a relation of the following (1).

$$0.15 \leq D/L \leq 0.85 \tag{1}$$

In the present embodiment, a heat cycle test was performed for the capacitor module 1 in which the values of the above (1) were changed and the presence or absence of the occurrence of solder cracking was checked.

Specifically, a capacitor element 3 having a 3225 size (an external size is 3.2 mm×2.5 mm) was mounted on the substrate 2 provided with the first and second pad electrodes 5a and 5b having an external size of 2.2 mm×2.5 mm and an inter-electrode length L of 1.3 mm. Furthermore, the substrate 2 was provided with the penetrating hole 8 in which the hole length D was changed for each capacitor element array 3A.

Furthermore, after a heat cycle test of a total 1,300 cycles was performed for the substrate 2 under the condition that one cycle was 30 minutes at −40° C. and 30 minutes at 125° C., the presence or absence of the occurrence of the solder cracking was confirmed.

Figure 8:
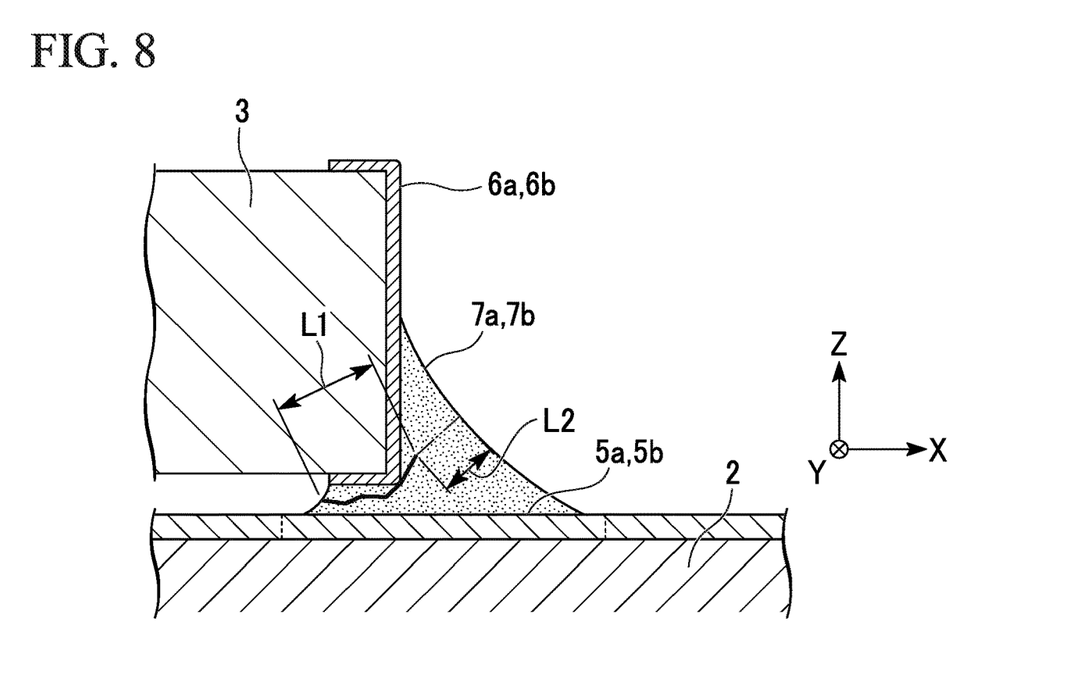
FIG. 8 is a sectional view for explaining a crack ratio of a crack occurring in a soldered part.

For the presence or absence of the occurrence of the solder cracking, a crack ratio of a crack occurred in the first and second soldered parts 7a and 7b was calculated for each hole length D. The crack ratio is a value calculated using the following (2) when the length of a crack occurring in the first and second soldered parts 7a and 7b is set as L1 and the shortest length existing in the first and second soldered parts 7a and 7b is set as L2 as illustrated in FIG. 8.

$$\text{Crack ratio (\%)} = \{L1/(L1+L2)\} \times 100 \tag{2}$$

In the present embodiment, an average value of the crack ratios was calculated for the capacitor element arrays 3A in which the hole lengths D were different from one another. Then, for the presence or absence of the occurrence of the solder cracking, an optimal hole length D was calculated employing a position, in which the crack ratio was 50%, as a reference. The results are collectively illustrated in the graph of FIG. 9.

Figure 9:
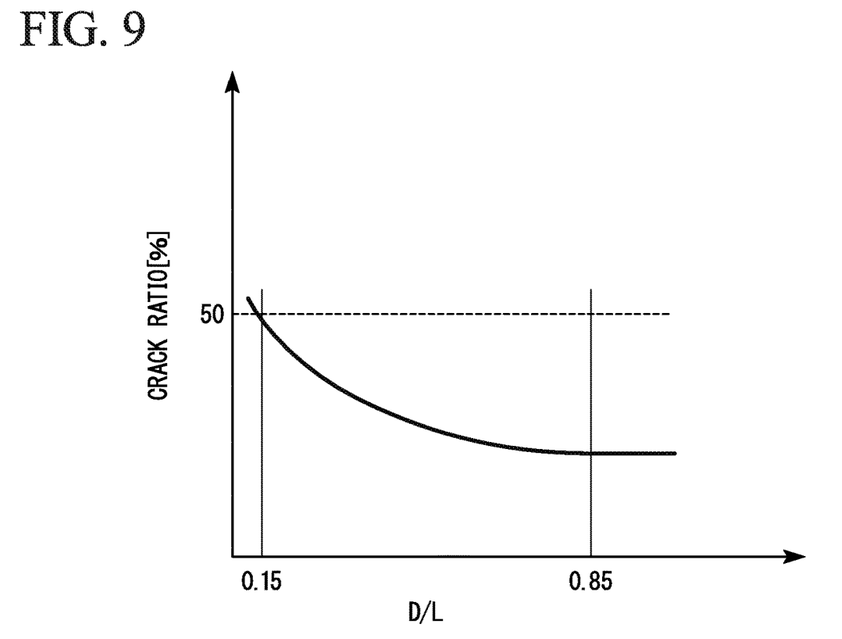
FIG. 9 is a graph illustrating a result obtained by measuring a crack ratio in a soldered part after a heat cycle test.

As illustrated in the graph of FIG. 9, when the crack ratio deviates from the lower limit value (D/L=0.15) of the above (1), the crack ratio becomes 50% or more. In such a case, since the effect of suppressing the occurrence of the solder cracking by providing the penetrating holes 8 is not sufficient, fatigue life according to the heat cycle is reduced.

On the other hand, when the crack ratio departs from the upper limit value (D/L=0.85) of the above (1), the crack ratio was hardly reduced (in such a case, the crack ratio is 10% or less). In such a case, as the hole length D becomes larger, the mechanical strength of the substrate 2 decreases.

Consequently, in the capacitor module 1 of the present embodiment, when the relation of the above (1) is satisfied, it is possible to reduce the occurrence of the solder cracking in the first and second soldered parts 7a and 7b and to extend fatigue life of the capacitor module 1 according to the heat cycle while keeping the mechanical strength of the substrate 2.

In addition, in the capacitor module 1 of the present embodiment, the penetrating hole 8 having a circular shape in the plan view is formed due to ease of machining of the substrate 2; however, the present invention is not limited to the shape of the penetrating hole 8 and for example, it is also possible to form the penetrating hole 8 having an oval shape, a long hole shape, other shapes and the like in the plan view.

Furthermore, in the capacitor module 1 of the present embodiment, the outline of the capacitor element 3 and the pair of boundary lines S1 and S2 approximately coincide with each other due to a self-alignment effect due to mounting. On the other hand, a case, where the outline of the capacitor element 3 and the pair of boundary lines S1 and S2 do not coincide with each other due to a difference between sizes and the like of the first and second terminal electrodes 6a and 6b (chips) and the first and second pad electrodes 5a and 5b (lands), may also be conceived. In such a case, it is sufficient if the hole length D of the penetrating hole 8 on the pair of boundary lines S1 and S2 is decided by deciding the position of the penetrating hole 8 based on the boundary lines S1 and S2 and considering a deviation amount of the outline of the capacitor element 3 with respect to the pair of boundary lines S1 and S2.

Furthermore, the capacitor module 1 of the present embodiment has a first connection terminal 10*a* electrically connected to one end side of the second wiring 4*b* in the second direction, and a second connection terminal 10*b* electrically connected to the other end side of the third wiring 4*c* in the second direction as illustrated in FIG. 3.

The first connection terminal 10*a* and the second connection terminal 10*b* are external connection terminals of the capacitor module 1, and are provided on land parts 11*a* and 11*b* protruding in a rectangular shape outward in the first direction from one end side of the second wiring 4*b* and the other end side of the third wiring 4*c*. In this way, the first connection terminal 10*a* and the second connection terminal 10*b* are provided at symmetrical positions (diagonal positions in the present embodiment) while the capacitor element group 30 is interposed between in the plane of the substrate 2.

In such a case, between the first connection terminal 10*a* and the second connection terminal 10*b*, a current path from one connection terminal (the first connection terminal 10*a* in the present embodiment) to the other connection terminal (the second connection terminal 10*b* in the present embodiment) can be equalized among the capacitor element arrays 3A constituting the capacitor element group 30.

That is, a current inputted from the first connection terminal 10*a* reaches the other end side from one end side of each capacitor element array 3A constituting the capacitor element group 30 via the second wiring 4*b*, and is outputted to the second connection terminal 10*b* via the third wiring 4*c*.

In such a case, among the capacitor element arrays 3A constituting the capacitor element group 30, the length of the current path of a current I1 flowing through the capacitor element array 3A positioned at one end side in the second direction, the length of the current path of a current I2 flowing through the capacitor element array 3A positioned at the center side in the second direction, and the length of the current path of a current I3 flowing through the capacitor element array 3A positioned at the other end side in the second direction are identical to one another between the first connection terminal 10*a* and the second connection terminal 10*b*.

In this way, in the capacitor module 1 of the present embodiment, the currents I1 to I3 can approximately equally flow through the plurality of capacitor elements 3 mounted on the substrate 2. Consequently, in the capacitor module 1 of the present embodiment, it is possible to suppress generation of heat from each capacitor element 3 while avoiding the probability that the current will be concentrated on some capacitor elements 3 and these capacitor elements 3 will break.

Furthermore, the capacitor module 1 of the present embodiment has a structure in which the plurality of capacitor elements 3 are mounted at overlapping positions on the first principal surface 2*a* and the second principal surface 2*b* in the plan view. In such a case, it is possible to achieve miniaturization and integration of the capacitor module 1 while suppressing the generation of heat from each capacitor element 3 on both principal surfaces 2*a* and 2*b* of the substrate 2.

Furthermore, in the capacitor module 1 of the present embodiment, the first connection terminal 10*a* and the second connection terminal 10*b* are provided at diagonal positions while interposing the capacitor element group 30 therebetween in the plane of the substrate 2. In such a case, it is possible to minimize the length of a current path through which one end side of the second wiring 4*b* and the first connection terminal 10*a* are electrically connected to each other and the length of a current path through which the other end side of the third wiring 4*c* and the second connection terminal 10*b* are electrically connected to each other. In this way, it is possible to minimize loss due to wiring patterns.

The capacitor module 1 of the present embodiment can be preferably used as the power transmission side capacitor C1 and the power reception side capacitor C2 respectively constituting the power transmission side resonator 203 and the power reception side resonator 301. That is, the capacitor module 1 of the present embodiment can constitute the power transmission side capacitor C1 and the power reception side capacitor C2 compatible with the power transmission side resonator 203 and the power reception side resonator 301 to which large capacity of high frequency current and voltage are applied.

Consequently, in the wireless power transmission system 100 of the present embodiment, it is possible to stably perform wireless power transmission by using the magnetic field resonance method between the power transmission device 200 including such a power transmission side resonator 203 and the power reception device 300 including such a power reception side resonator 301.

It should be understood that the present invention is not limited to the aforementioned embodiment and various modifications can be made without departing from the spirit or scope of the present invention.

Figure 10:
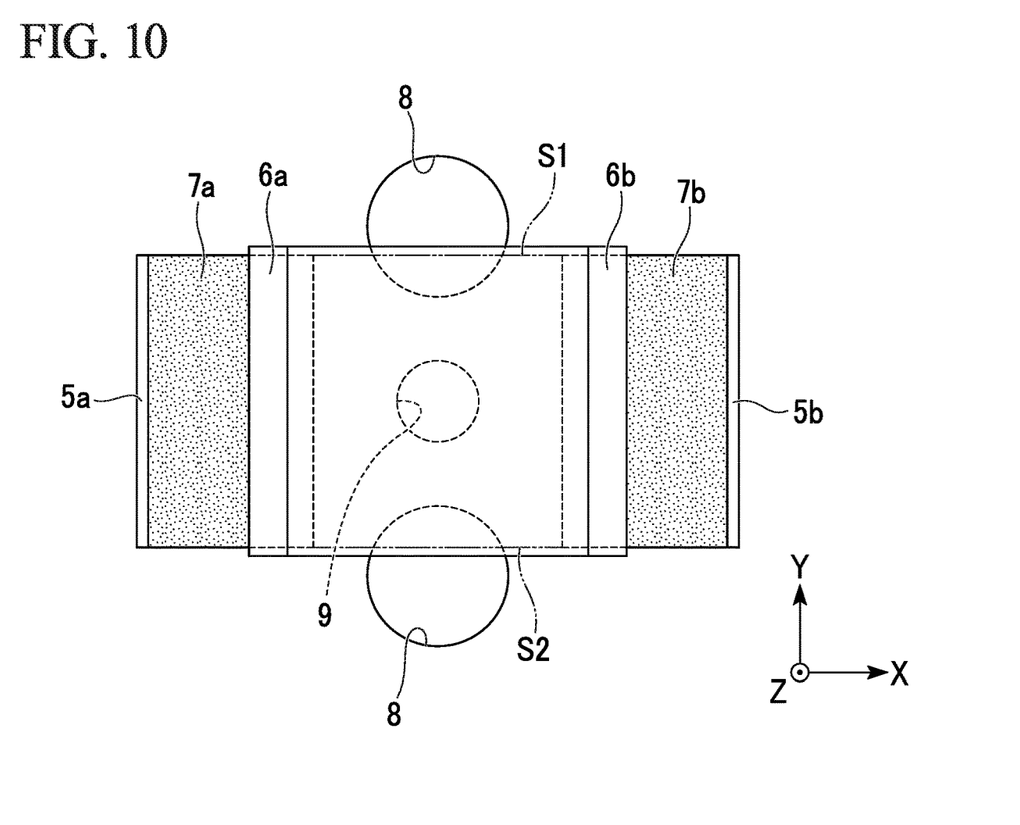
FIG. 10 is a plan view illustrating main elements of another configuration example of the capacitor module to which the present invention is applied.

For example, in the aforementioned capacitor module 1, in addition to the penetrating holes 8, for example, as illustrated in FIG. 10, a penetrating hole 9 may be provided between the pair of boundary lines S1 and S2 to pass through the substrate 2 in the thickness direction.

Specifically, in the present embodiment, the penetrating hole 9 having a circular shape in the plan view is provided between (at the center in the present embodiment) the penetrating holes 8 provided at positions overlapping the pair of boundary lines S1 and S2 in the plan view. The penetrating hole 9, for example, may have an oval shape, a long hole shape, other shapes and the like in the plan view, similarly to the penetrating hole 8. Moreover, it is also possible to form a plurality of penetrating holes 9.

In such a configuration, it is preferable that the opening area (the hole diameter) of the penetrating hole 8 provided at the position overlapping the pair of boundary lines S1 and S2 in the plan view is larger than the opening area (the hole diameter) of the penetrating hole 9 positioned between the pair of boundary lines S1 and S2. In this way, it is possible to further reduce creep strain occurring in the first and second soldered parts 7*a* and 7*b* while preventing the opening area (the hole diameter) of the penetrating hole 9 from being excessively increased, so that it is possible to further suppress the occurrence of solder cracking in the first and second soldered parts 7*a* and 7*b*.

Furthermore, it should be understood that the aforementioned capacitor module 1 is not limited to the configuration in which the first connection terminal 10*a* and the second connection terminal 10*b* are provided at diagonal positions while interposing the capacitor element group 30 therebetween.

Figure 11:
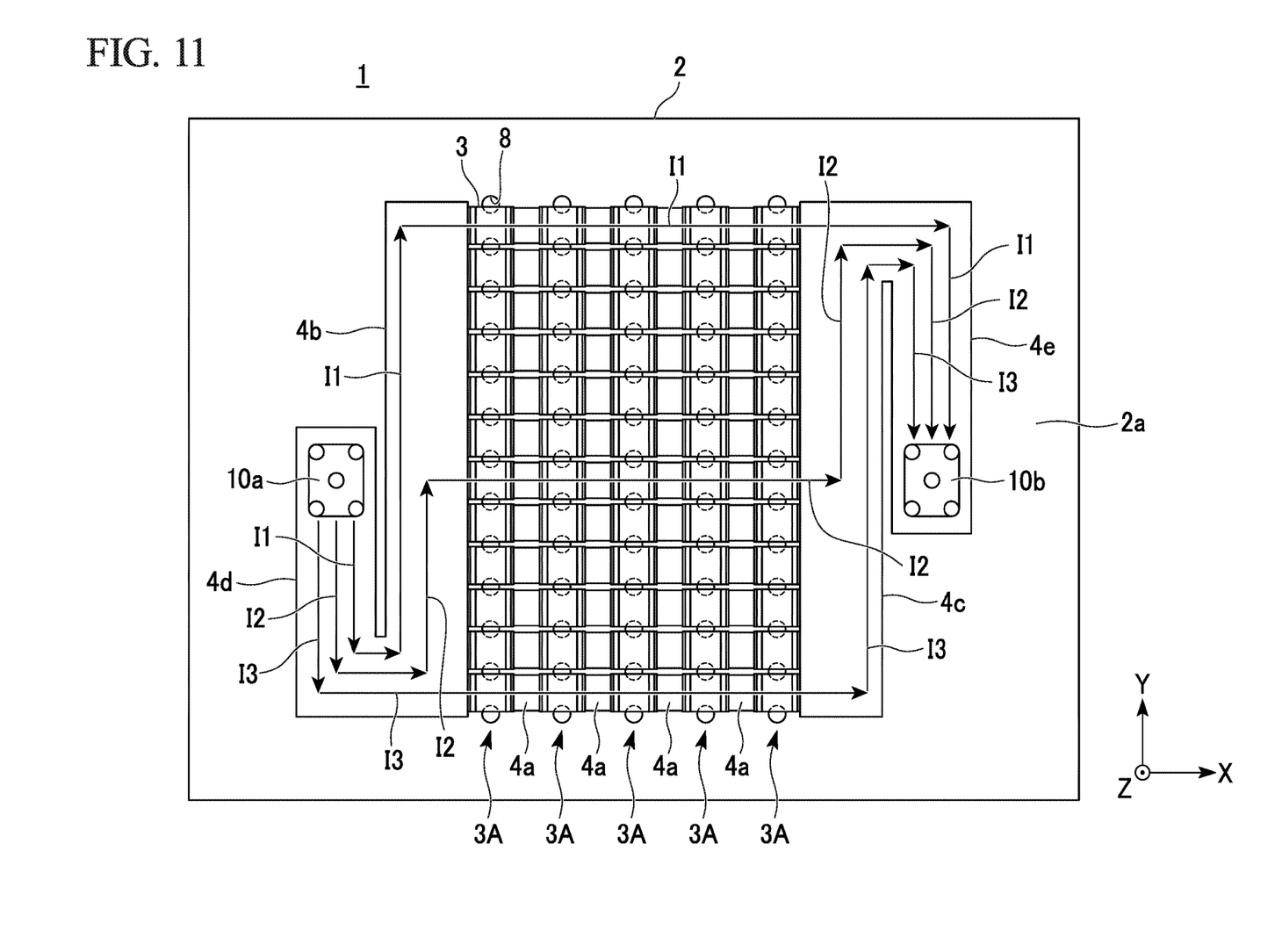
FIG. 11 is a plan view illustrating another configuration example of the capacitor module to which the present invention is applied.

For example, it is also possible to employ a configuration in which as illustrated in FIG. 11, one end side of the second wiring 4*b* and the first connection terminal 10*a* are electrically connected to each other via a first extension wiring 4*d* extending from one end side of the second wiring 4*b* to the other end side in the second direction. In such a configuration, the position of the first connection terminal 10*a* can be moved around the center of the capacitor element group 30 in the second direction from the diagonal position of the capacitor element group 30 due to the first extension wiring 4*d*.

Similarly, it is also possible to employ a configuration in which the other end side of the third wiring 4*c* and the second connection terminal 10*b* are electrically connected to each other via a second extension wiring 4*e* extending from the other end side of the third wiring 4*c* to one end side in the second direction. In such a configuration, the position of the second connection terminal 10*b* can be moved around the center of the capacitor element group 30 in the second direction from the diagonal position of the capacitor element group 30 due to the second extension wiring 4*e*.

In any case, the lengths of current paths from the first connection terminal 10*a* to the second connection terminal 10*b* can be equalized among the capacitor element arrays 3A constituting the capacitor element group 30 regardless of the extension length of the first extension wiring 4*d* or the second extension wiring 4*e*. Consequently, it is possible to improve the degree of freedom in design of the arrangement of the first connection terminal 10*a* and the second connection terminal 10*b* while suppressing the generation of heat from each capacitor element 3.

In addition, the present embodiment has described a case where the present invention is applied to a non-contact charging system that performs non-contact charging for a battery installed in the electric vehicle EV; however, the present invention can also be widely applied to an electrically driven vehicle (a moving body) such as a plug-in hybrid vehicle (PHEV), in addition to the electric vehicle EV.

Furthermore, a power transmission system employing the present invention is not limited to such a non-contact charging system. In addition, for example, the present invention can also be widely applied to a non-contact charging system that performs non-contact charging for a portable electronic device such as a tablet terminal and a personal computer (PC) placed on a table, a non-contact power feeding system that performs non-contact power feeding for an electrically driven vehicle which is traveling, and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1 Capacitor module
2 Substrate
2*a* First principal surface
2*b* Second principal surface
3 Capacitor element
4*a* First wiring
4*b* Second wiring
4*c* Third wiring
5*a* First pad electrode
5*b* Second pad electrode
6*a* First terminal electrode
6*b* Second terminal electrode
7*a* First soldered part
7*b* Second soldered part
8, 9 Through hole
E Region
S1, S2 Boundary line
100 Wireless power transmission system
200 Wireless power transmission device
201 Power supply circuit
202 Driving circuit
203 Power transmission side resonator
300 Wireless power reception device
301 Power reception side resonator
302 Load
303 Rectification circuit
L1 Power transmission side coil
L2 Power reception side coil
C1 Power transmission side capacitor
C2 Power reception side capacitor
EV Electric vehicle

What is claimed is:

1. A capacitor module comprising:
   a substrate having a first principal surface and a second principal surface opposite to each other in a thickness direction; and
   at least one capacitor element mounted on at least the first principal surface of the substrate,
   wherein the substrate has a first pad electrode solder-bonded to a first terminal electrode provided at one end side of the capacitor element and a second pad electrode solder-bonded to a second terminal electrode provided at the other end side of the capacitor element,
   wherein penetrating holes are provided at positions, which overlap a pair of boundary lines that define a boundary between at least a region between the first pad electrode and the second pad electrode and an outside of the region in a plan view, and pass through the substrate in the thickness direction,
   wherein the at least one capacitor element comprises a plurality of capacitor elements,
   wherein the plurality of capacitor elements are juxtaposed in a plane of the substrate in a direction crossing the pair of boundary lines, and
   the penetrating holes are provided in a state of overlapping a boundary line of one capacitor element side and a boundary line of the other capacitor element side, which are adjacent to each other, in an arrangement direction of the plurality of capacitor elements in the plan view.

2. The capacitor module according to claim 1, wherein the plurality of capacitor elements are mounted at overlapping positions on the first principal surface and the second principal surface in the plan view, and
   the penetrating holes are provided in a state of overlapping the pair of boundary lines, which define a region between the first pad electrode and the second pad electrode of the first principal surface side, and the pair of boundary lines, which define a region between the first pad electrode and the second pad electrode of the second principal surface side, in the plan view.

3. The capacitor module according to claim 1, wherein the penetrating holes are provided at positions overlapping an outline of the capacitor element in the plan view.

4. The capacitor module according to claim 3,
   wherein the plurality of capacitor elements are mounted at overlapping positions on the first principal surface and the second principal surface in the plan view, and
   the penetrating holes are provided in a state of overlapping the pair of boundary lines, which define a region between the first pad electrode and the second pad electrode of the first principal surface side, and the pair of boundary lines, which define a region between the first pad electrode and the second pad electrode of the second principal surface side, in the plan view.

5. A resonator including a coil and a capacitor, wherein the capacitor module according to claim 1 is provided as the capacitor.

6. A wireless power transmission device comprising the resonator according to claim 5.

7. A wireless power reception device comprising the resonator according to claim 5.

8. A wireless power transmission system that performs wireless power transmission to a power reception device from a power transmission device, wherein
at least one of the power transmission device and the power reception device includes the resonator according to claim 5.

9. A capacitor module comprising:
a substrate having a first principal surface and a second principal surface opposite to each other in a thickness direction; and
at least one capacitor element mounted on at least the first principal surface of the substrate,
wherein the substrate has a first pad electrode solder-bonded to a first terminal electrode provided at one end side of the capacitor element and a second pad electrode solder-bonded to a second terminal electrode provided at the other end side of the capacitor element,
wherein penetrating holes are provided at positions, which overlap a pair of boundary lines that define a boundary between at least a region between the first pad electrode and the second pad electrode and an outside of the region in a plan view, and pass through the substrate in the thickness direction, and
wherein, when a length on the boundary line between the first pad electrode and the second pad electrode is set as L and a length of the penetrating hole on the boundary line is set as D, a relation of $0.15 \leq D/L \leq 0.85$ is satisfied.

10. A resonator including a coil and a capacitor, wherein the capacitor module according to claim 9 is provided as the capacitor.

11. A wireless power transmission device comprising the resonator according to claim 10.

12. A wireless power reception device comprising the resonator according to claim 10.

13. A wireless power transmission system that performs wireless power transmission to a power reception device from a power transmission device, wherein
at least one of the power transmission device and the power reception device includes the resonator according to claim 10.

14. A capacitor module comprising:
a substrate having a first principal surface and a second principal surface opposite to each other in a thickness direction; and
at least one capacitor element mounted on at least the first principal surface of the substrate,
wherein the substrate has a first pad electrode solder-bonded to a first terminal electrode provided at one end side of the capacitor element and a second pad electrode solder-bonded to a second terminal electrode provided at the other end side of the capacitor element,
wherein penetrating holes are provided at positions, which overlap a pair of boundary lines that define a boundary between at least a region between the first pad electrode and the second pad electrode and an outside of the region in a plan view, and pass through the substrate in the thickness direction,
wherein a penetrating hole is provided in a region inward from the pair of boundary lines to pass through the substrate in the thickness direction, and
an opening area of a penetrating hole provided at a position overlapping the boundary line in the plan view is larger than an opening area of the penetrating hole provided in the region inward from the pair of boundary lines.

15. A resonator including a coil and a capacitor, wherein the capacitor module according to claim 14 is provided as the capacitor.

16. A wireless power transmission device comprising the resonator according to claim 15.

17. A wireless power reception device comprising the resonator according to claim 15.

18. A wireless power transmission system that performs wireless power transmission to a power reception device from a power transmission device, wherein
at least one of the power transmission device and the power reception device includes the resonator according to claim 15.

* * * * *